United States Patent
Ishibashi

(10) Patent No.: US 7,864,826 B2
(45) Date of Patent: Jan. 4, 2011

(54) OPTICAL TRANSMITTER APPLICABLE TO BURST SIGNAL AND METHOD FOR CONTROLLING THE SAME

(75) Inventor: Hiroto Ishibashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 105 days.

(21) Appl. No.: 12/427,189

(22) Filed: Apr. 21, 2009

(65) Prior Publication Data
US 2009/0268766 A1   Oct. 29, 2009

(30) Foreign Application Priority Data
Apr. 28, 2008   (JP) .............................. 2008-117287

(51) Int. Cl.
*H01S 3/00* (2006.01)
(52) U.S. Cl. .................................... 372/38.01; 398/198
(58) Field of Classification Search ............ 372/29.015, 372/38.01, 29.014, 38.07
See application file for complete search history.

(56) References Cited

U.S. PATENT DOCUMENTS

| | | | | |
|---|---|---|---|---|
| 6,466,595 B2 * | 10/2002 | Asano | .................... | 372/29.021 |
| 7,426,224 B2 * | 9/2008 | Ishibashi | .................. | 372/29.01 |
| 7,783,204 B2 * | 8/2010 | Ishibashi | .................... | 398/198 |
| 2005/0030985 A1 * | 2/2005 | Diaz et al. | ............. | 372/29.015 |

FOREIGN PATENT DOCUMENTS

| JP | 7-273388 | 10/1995 |
|---|---|---|
| JP | 2000-49715 | 2/2000 |

* cited by examiner

*Primary Examiner*—Minsun Harvey
*Assistant Examiner*—Tuan N. Nguyen
(74) *Attorney, Agent, or Firm*—Smith, Gambrell & Russell, LLP

(57) ABSTRACT

An optical transmitter and a method to control the transmitter are disclosed, in which the optical output may be substantially maintained even in the inactive state of the input burst signal. The optical transmitter includes the APC feedback control and the detector that senses the active and inactive states of the input burst signal. When the transition to the inactive state is detected, the controller enters the second APC mode in which only the bias current is adjusted so as to maintain the optical output to be a preset value. The normal APC feedback control may be recovered after a preset period from the practical transition of the input burst signal from the inactive state to the active state.

8 Claims, 3 Drawing Sheets

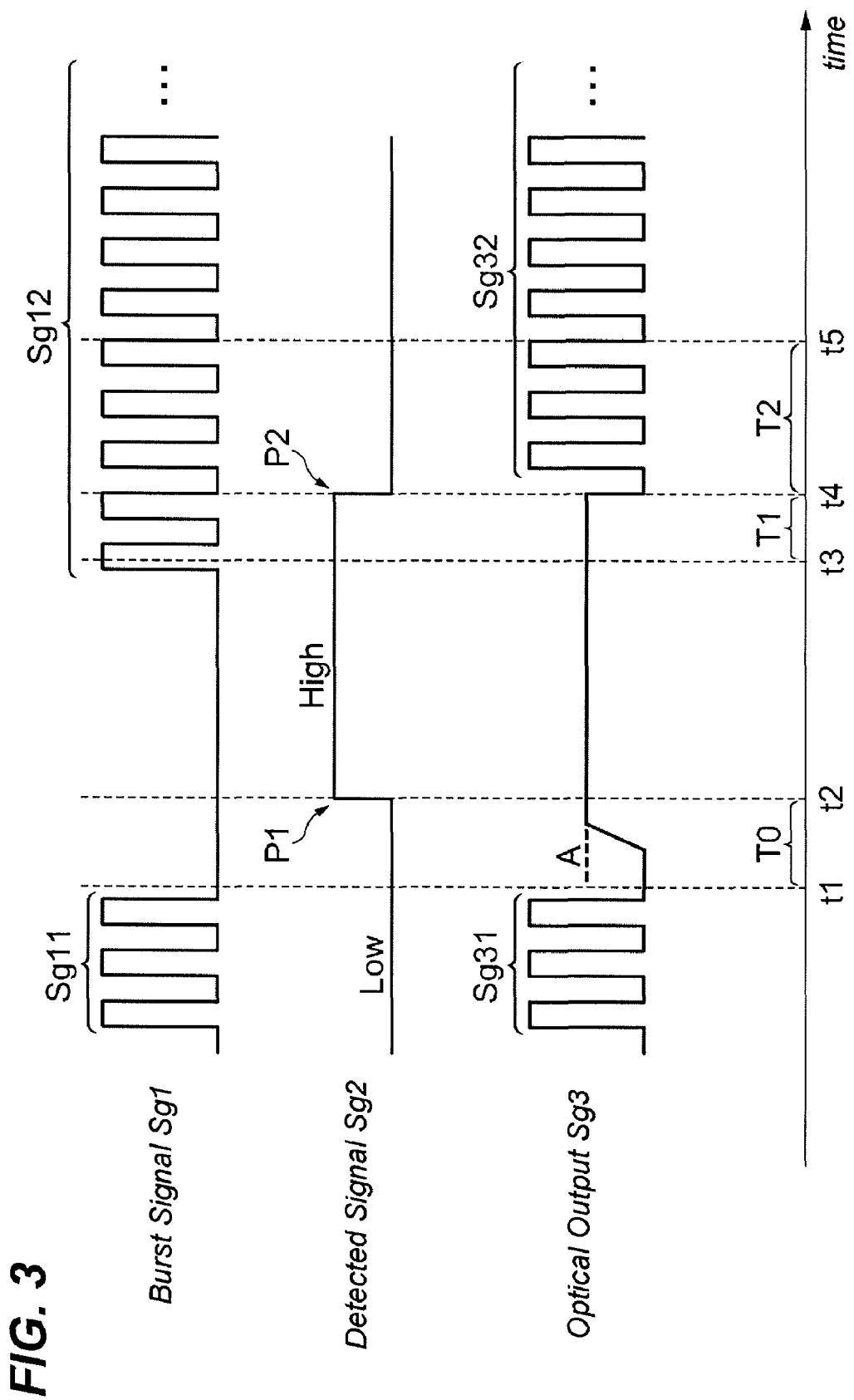

OPTICAL TRANSMITTER APPLICABLE TO BURST SIGNAL AND METHOD FOR CONTROLLING THE SAME

BACKGROUND OF THE INVENTION

1. Field of the Invention

The present invention relates to an optical transmitter implemented with a semiconductor laser diode and a method to control the optical transmitter.

2. Related Background Art

Various prior arts have reported methods to prevent a semiconductor laser diode (hereafter denoted as LD) from emitting extraordinarily when a driving signal is initially provided to the LD. A Japanese Patent Application published as JP-H07-273388A has disclosed one of such methods, in which the optical transmitter provides a feedback loop that controls the bias current supplied to the LD. This feedback loop stops the supply of the bias current to the LD when the driving signal is lost. Another Japanese Patent application published as JP-2000-049715A has disclosed an optical transmitter that provides, even when the input driving signal is lost, a pseudo random pattern to the LD to operate the feedback loop to maintain the optical output power from the LD constant. An optical switch may suspend the light derived from the pseudo random pattern from outputting from the transmitter.

The method that stops the supply of the current to the LD when the input driving signal is lost stops the emission of the LD itself. The suspension of the light emission may cause a failure in equipments connected in downstream of the transmitter. For instance, no input optical signal may put in an out of order of the automatic gain control of the optical amplifier. Another method to supply the pseudo random signal to the LD is necessary to provide at least another two components, one of which is a signal generator of the pseudo random pattern and the other is an optical switch to prevent the light with the random pattern from being output from the transmitter in addition to the possibility to cause the failure in the downstream equipments.

SUMMARY OF THE INVENTION

One aspect of the present invention relates to a method to control an optical transmitter. The transmitter, which includes an APC feedback and a detector, may be applicable for the burst signal to be transmitted. The APC feedback if formed by an LD, a PD, a controller and a driver. The detector may sense the input burst signal and may decide whether the input burst signal is in the active state or in the inactive state. One feature of the control method of the invention is that the method comprises steps of: (a) detecting whether the input burst signal is in the active state or in the inactive state by the detector; (b) changing the operating mode of the APC feedback to the second mode when the detector detects the transition of the input burst signal from the active state to the inactive state, wherein the second mode of the APC feedback adjusts only the bias current to be supplied to the LD through the driver so as to keep the optical output power from the LD in a preset value; (c) changing the operating mode of the APC feedback to the first mode when the detector detects the other transition of the input burst signal from the inactive state to the active state, wherein the first mode of the APC feedback adjusts both the bias current and the modulation current to be supplied to the LD through the driver so as to keep the optical output power from the LD in the other preset value.

In the present method, the change of the operating mode of the APC feedback to the second mode may be carried out with a first delay from the practical transition of the input burst signal from the active state to the inactive state. Also, the change of the operating mode of the APC feedback to the first mode may be carried out with a second delay from the practical transition of the input burst signal from the inactive state to the active state. The method of the present invention may further provide a step, during the second delay, for providing the bias current and the modulation current whose magnitudes are decided without using the APC feedback. The modulation current and the bias current supplied to the LD during the second delay are set to be equal to values practically supplied to the LD in a last APC feedback in the first mode.

Another aspect of the present invention related to an optical transmitter that is applicable for the burst signal and comprises an LD, a PD, a controller, a driver and a detector. The LD, the PD, the controller and the driver constitute the APC feedback that has two operating mode. The first operating mode adjusts both the bias current and the modulation current to be supplied to the LD, while, the second operating mode adjusts only the bias current. The detector detects the active state and the inactive sate of the burst signal. The controller changes the operating mode of the APC feedback from the first mode to the second mode when the detector detects the transition of the burst signal from the active state to the inactive state, while, the controller changes the operating mode from the second mode to the first mode when the detector detects the transition of the burst signal from the inactive state to the active state.

The controller of the present invention may change the operating mode to the second mode with a first delay after the practical transition of the bust signal from the active state to the inactive state. Further, the controller may change the operating mode to the first mode with a second delay after the practical transition of the burst signal from the inactive state to the active state. During the second delay, the controller may set the bias current and the modulation current to be supplied to the LD to be equal to values practically supplied in a last APC feedback in the first mode without using the APC feedback.

These and other exemplary embodiments, features, aspects, and advantages of the present invention will be described and become apparent from the following detailed description of exemplary embodiments, which is to be read in connection with the accompanying drawings.

BRIEF DESCRIPTION OF DRAWINGS

FIG. 3 shows time charts of signals concerning to the optical transmitter of the present invention.

DESCRIPTION OF PREFERRED EMBODIMENTS

Figure 1:
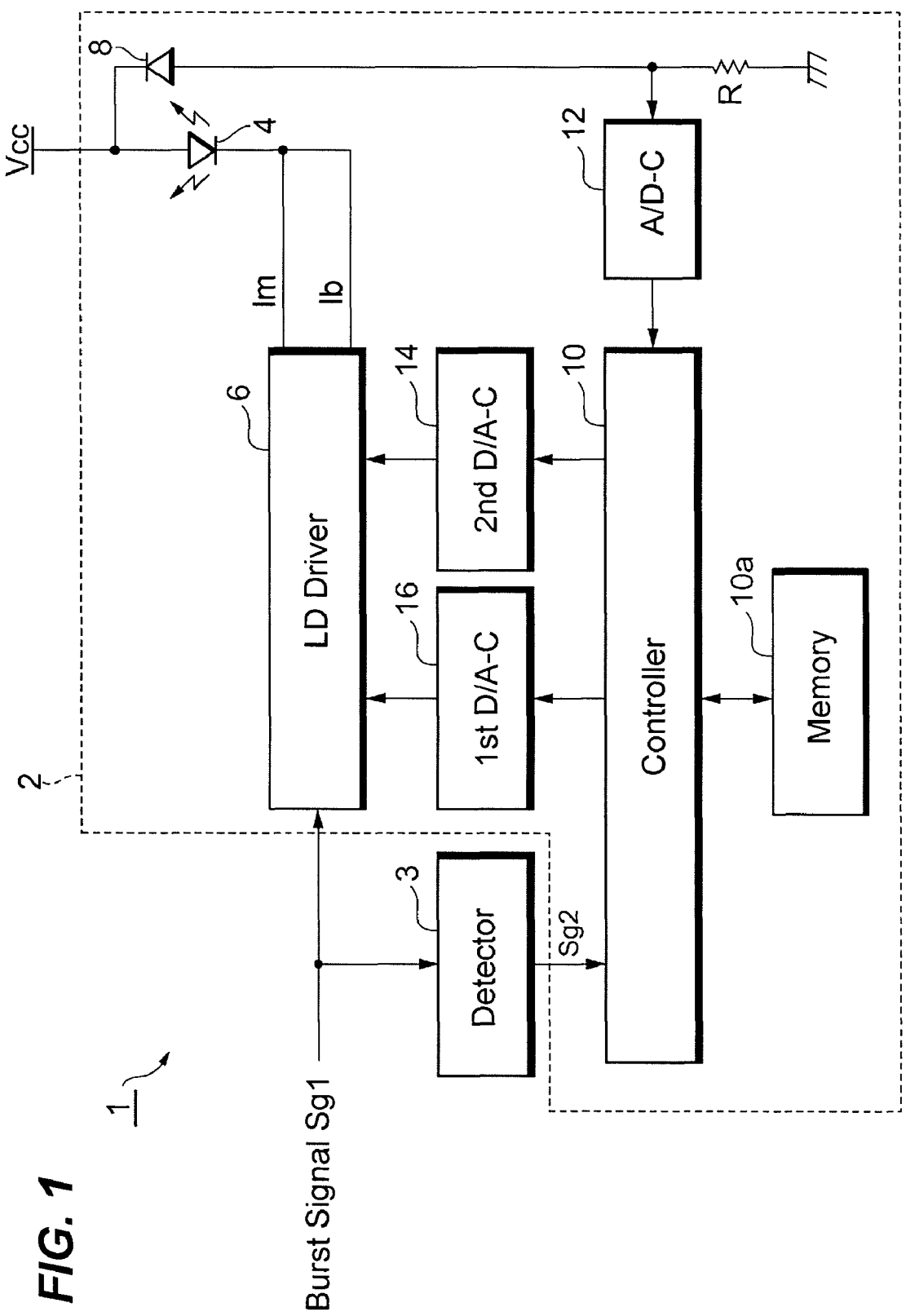
FIG. 1 is a schematically drawing of the block diagram of the optical transmitter according to the present invention.

Next, preferred embodiments according to the present invention will be described as referring to accompanying drawings. In the description of the drawings, the same numerals or the same symbols will refer to the same elements without overlapping explanations. FIG. 1 schematically illustrates the block diagram of the optical transmitter according to the present invention. The optical transmitter 1 shown in the figure outputs an optical signal responding to a burst electrical signal externally provided from the outside of the optical transmitter 1. The optical transmitter 1 provides an automatic power control feedback (hereafter denoted as APC feedback) 2 and an optical detector 3.

The APC feedback 2 includes an LD 4, an LD driver 6, a monitor photodiode (hereafter denoted as PD) 8, and a controller 10. The controller 10 includes a memory 10a and an analog-to-digital converter (hereafter denoted as A/D-C) 12, the first digital-to-analog converted (hereafter denoted as D/A-C) 14 to set the bias current to the LD 4 and the second D/A-C 16 to set the modulation current to the LD 4. The LD 4 emits light Sg3 by being supplied with the bias current Ib and the modulation current Im from the LD driver 6. The modulation current Im directly modulates the light Sg3 whose signal shapes are shown as the optical signals, Sg31 and Sg32, illustrated in FIG. 3. The anode of the LD 4 is coupled with the power supply Vcc, while, the cathode thereof is coupled with the LD driver 6 to receive the bias current Ib and the modulation current Im.

The LD driver 6, as described above, provides the bias and modulations currents, Ib and Im, to the LD 4. Receiving the external burst signal Sg1, the LD driver 6 generates the modulation current Im corresponding to this burst signal, for instance, Sg11 or Sg12 shown in FIG. 3. The monitor PD 8 detects a portion of the light Sg3 emitted from the LD 4. The electrical signal output from the PD 8 is received by the controller 10 after it is converted to a digital form by the A/D-C 12. The anode of the PD 8 is coupled with the A/D-C 12 and also grounded through the resistor R. Because the PD 8 outputs the photocurrent that reflects the light from the LD 4, this resistor R converts the photocurrent into a voltage form, and the A/D-C 14 may convert this voltage signal in the analog form into the digital signal.

The controller 10 that controls the APC feedback 2 may be a signal processor that may include the CPU, the ROM, and the RAM in addition to the memory 10a. This memory 10a may be integrated with the RAM. The controller 10, generates signals to adjust the bias current Ib and to adjust the modulation current Im, where they are provided to the LD driver 6 after converting them into the analog form by respective D/A-Cs, 14 and 16.

Receiving the signal Sg2 that indicates the loss of the bust signal from the detector 3, the controller 10 controls the LD driver 6 such that the LD driver 6 stops the supply of the modulation current Im and continues the supply of the bias current Ib. On the other hand, receiving the signal Sg2 that indicates the recover of the bust signal from the detector 3, the controller 10 controls the LD driver 6 such that the controller 10 stops the APC feedback for a preset period, the period T2 illustrated in FIG. 3, and sets the bias current Ib and the modulation current Im in respective preset conditions, specifically, the values finally set by the APC feedback 2 operated in the first mode when the burst signal is live. The ROM or the memory 10a in the controller 10 may preserve the preset period T2 to stop the APC feedback 2 and respective current conditions.

The memory 10a, which is a type of random access memory able to write data therein and to read data therefrom, is coupled with the controller 10. As mentioned earlier, this memory 10a may be included within the controller, or may be set external of the controller. The memory 10a stores a program to control the APC feedback 2 and various data used in the program, such as conditions for the bias current Ib and that for the modulation current Im. The optical transmitter further provides the detector 3, which may include a CPU not explicitly shown in FIG. 1. The detector 3, receiving the burst signal Sg1, detects the active and inactive states of this burst signal and outputs the detected signal Sg2 corresponding to these two states to the controller 10.

Figure 2:
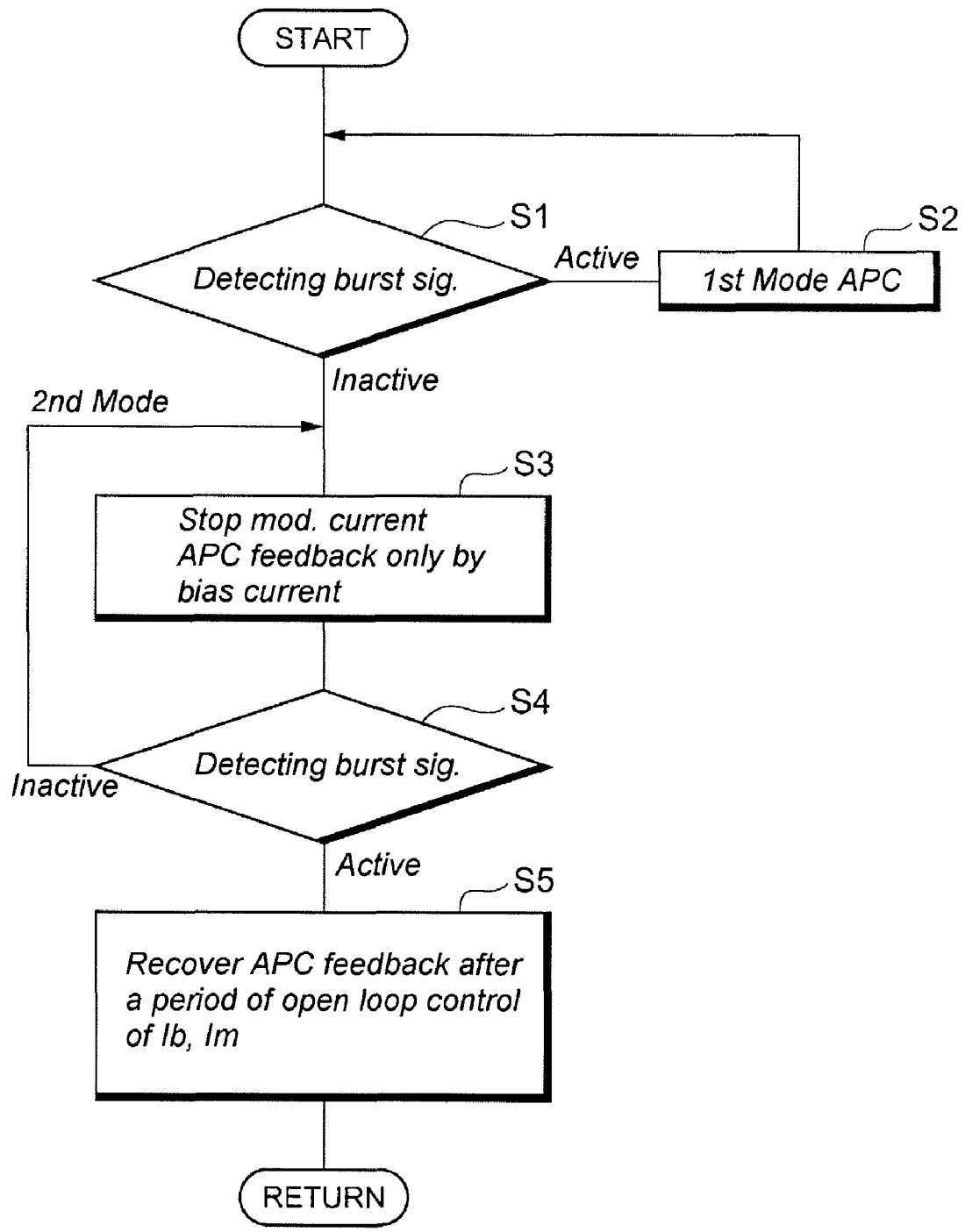
FIG. 2 is a flow chard of the optical transmitter that shows the operating algorithm of the present optical transmitter.

Next, the operation of the optical transmitter 1 will be described as referring to FIGS. 2 and 3. FIG. 2 is a flow chart to illustrate the algorithm of the operation in the optical transmitter 1, while, FIG. 3 exemplarily shows time charts of the burst signal Sg1, the detected signal Sg2 and the optical output Sg3.

The detected signal Sg2, which includes the active and inactive states of the input burst signal Sg1, is output from the detector 3 to the controller 10. The Low states of the detected signal Sg2 corresponds to the active state of the input burst signal Sg1, while, the High state of the detected signal Sg2 reflects the inactive state of the burst signal Sg1. Sensing a condition where the input burst signal Sg1 becomes inactive at t1, the detector 3 sets the output detected signal Sg2 to be High in a case the burst signal recovers its active state during a period of T0, from t1 to t2. On the other hand, when the controller 3 senses the recover of the burst signal Sg1 at t3, the controller converts the output detected signal Sg2 from High state to Low state after a preset delay of T1 from t3 to t4. Thus, the inactive state of the input burst signal Sg1 is reflected in the rising edge P1 of the detected signal Sg2 after the preset period T1 from the practical change of the burst signal Sg1, while, the active state of the burst signal Sg1 is appeared in the falling edge P2 of the detected signal Sg2 after the preset period T1 from the practical change from the inactive to the active state in the burst signal Sg1. These preset delays, T0 and T1, may be stored in the memory installed within the detector 3.

Assuming a condition where the input burst signal Sg11 is provided to the detector 3 and also to the LD driver 6, and the controller 10 carries out the APC feedback 2. Under this condition, the detector 3 sets its output, the detected signal Sg2, to be Low and the optical output Sg31 reflects this burst signal.

Referring to FIG. 2, the controller 10 monitors the detected signal Sg2 and decides whether this detected signal Sg2 is in Low that corresponds to the active state of the burst signal Sg1 or in High corresponding to the inactive state at step S1. The controller performs the APC feedback 2 until it senses a condition where the detected signal Sg2 changes its state to High that corresponds to the inactive state of the input burst signal Sg1, at step S2. During the APC feedback control, the controller repeatedly stores the conditions for the bias and modulation currents provided through respective D/A-Cs, 14 and 16, in the memory 10a. When the burst signal Sg1 becomes inactive during the APC feedback 2 and the controller 10 detects the state where the optical output Sg3 stops, the controller 10 enters in another APC mode at t1 so as to keep the output from the monitor PD 8 to be in a preset value hat corresponds to the output power A of the output light S3, which is illustrated in FIG. 3. The output power A may be set in a minimum value such that the apparatus coupled in the downstream of the optical transmitter 1 does not cause a failure. A digital data corresponds to this optical output power A may be stored in the ROM integrated within the controller 10, or in the memory 10a.

The controller 10, receiving the rising edge P1 of the detected signal Sg2 at t2, which corresponds to the state Inactive at step Si in FIG. 2, stops the modulation current i2 and performs the second APC feedback control to keep the optical output power constant in the value A by adjusting only the bias current Ib, at step S3. During the second APC feedback control, the controller 10 repeatedly watches the falling edge P2 of the detected signal Sg2 that corresponds to the recover of the burst signal Sg9, at steps S3 and S4.

The controller 10, detecting the falling edge P2 in the detected signal Sg2 at step S4, changes its mode to an open control mode where the APC feedback control 2 is stopped and the bias current Ib and the modulation current Im are set in preset values without referring to the output from the monitor PD 8, specifically, respective final values that are set in each D/A-C, 14 and 16, in the last APC feedback control 2, they are stored in the memory 10a. After the preset period T2 of the open loop control for two currents, Ib and Im, the controller 10 recovers the first APC feedback loop referring to the output from the monitor PD 8, at time t5. Because the modulation current i2 is provided to the LD 4 after t4, the optical output Sg3 from the LD 4 includes the modulated signal Sg32.

Thus, the controller 10, responding to the transition from the active state to the inactive state of the input burst signal Sg1, stops the modulation current Im and supplies only the bias current Ib to the LD 4; accordingly, the LD 4 may emit substantial light Sg3 even in the inactive state of the input burst signal Sg1. Moreover, the controller 10 recovers the ordinal APC feedback control after the preset period T2 from the recovering the active state from the inactive state of the input burst signal Sg1. During the period T2, the LD 4 is driven by the controller 10 under the open loop controlling without referring to the output of the monitor PD 8. Thus, an excess emission of the LD 4 at the transition from the inactive state to the active state may be effectively prevented.

What is claimed is:

1. A method to control an optical transmitter that includes an auto-power control feedback and a detector, said auto-power control feedback being formed by a semiconductor laser diode, a semiconductor photodiode, a controller and a driver, and a detector, said detector sensing an active state and an inactive state of an input burst signal, said method comprising steps of:

detecting whether said input burst signal is in said active state or in said in active state by said detector;

changing said auto-power control feedback in a second mode when said detector detects a transition of said input burst signal from said active state to said inactive sate, said second mode adjusting only a bias current to be supplied to said laser diode through said driver such that an optical output power from said laser diode to be kept in a preset value; and changing said auto-power control feedback in a first mode when said detector detects another transition of said input burst signal from said inactive state to said active state, said first mode adjusting said bias current and a modulation current to be supplied to said laser diode through said driver such that said optical output power from said laser diode to be kept in another preset value.

2. The method according to claim 1,
   wherein said change of said auto-power control feedback to said second mode is performed with a first delay after a practical transition of said input burst signal from said active state to said inactive sate.

3. The method according to claim 1,
   wherein said change of said auto-power control feedback in said first mode is performed with a second delay after a practical transition of said input burst signal from said inactive state to said active state.

4. The method according to claim 3,
   further including a step of controlling said bias current and said modulation current supplied to said laser diode without using said auto-power control feedback during said second delay.

5. The method according to claim 4,
   wherein said bias current and said modulation current supplied to said laser diode through said driver during said second delay are set to be equal to values practically supplied in a last auto-power control feedback in said first mode.

6. An optical transmitter, comprising:
   a semiconductor laser diode that emits light by responding an input burst signal;
   a photodiode that monitors a portion of said light and generates a monitored signal;
   a controller that outputs control signals for deciding a magnitude of a bias current and a magnitude of a modulation current;
   a driver that receives said control signals from said controller and drives said laser diode by providing a bias current and a modulation current modulated by said input burst signal, wherein said laser diode, said photodiode, said controller and said driver constitute an auto-power control feedback with a first mode and a second mode, said first mode adjusting both said bias current and said modulation current, said second mode adjusting only said bias current; and
   a detector that detects an active state and an inactive sate of said input burst signal,
   wherein said controller changes said mode of said auto-power control feedback from said first mode to said second mode when said detector detects a change of said input burst signal from said inactive states to said active state, and changes said mode from said second mode to said first mode when said detector detects a change of said input burst signal from said inactive state to said active state.

7. The optical transmitter according to claim 6,
   wherein said controller controls said driver without setting said auto-power control feedback for a second delay after said detector detects said change of said input burst signal from said inactive state to said active state.

8. The optical transceiver according to clam 7,
   further comprising a memory,
   wherein said controller stores said control signals set in said second mode of said auto-power control feedback in said memory and outputs said control signals stored in said memory during said second delay without operating said auto-power control feedback.

* * * * *